(12) United States Patent
Xiao et al.

(10) Patent No.: US 8,422,288 B2
(45) Date of Patent: Apr. 16, 2013

(54) DRAM CELL UTILIZING FLOATING BODY EFFECT AND MANUFACTURING METHOD THEREOF

(75) Inventors: Deyuan Xiao, Shanghai (CN); Xiaolu Huang, Shanghai (CN); Jing Chen, Shanghai (CN); Xi Wang, Shanghai (CN)

(73) Assignee: Shanghai Institute of Microsystem and Information Technology, Chinese Academy of Sciences, Changning District Shanghai (CN)

( * ) Notice: Subject to any disclaimer, the term of this patent is extended or adjusted under 35 U.S.C. 154(b) by 335 days.

(21) Appl. No.: 12/937,257

(22) PCT Filed: Jul. 14, 2010

(86) PCT No.: PCT/CN2010/075134
§ 371 (c)(1),
(2), (4) Date: Oct. 9, 2010

(87) PCT Pub. No.: WO2011/076003
PCT Pub. Date: Jun. 30, 2011

(65) Prior Publication Data
US 2011/0292723 A1  Dec. 1, 2011

(30) Foreign Application Priority Data

Dec. 25, 2009  (CN) .......................... 2009 1 0200965

(51) Int. Cl.
*G11C 11/34* (2006.01)

(52) U.S. Cl.
USPC ...... 365/175; 365/149; 365/189.16; 257/348; 257/335; 438/151; 438/154

(58) Field of Classification Search .................. 365/175, 365/149, 189.16; 257/348, 335; 438/151, 438/154
See application file for complete search history.

(56) References Cited

U.S. PATENT DOCUMENTS

| 6,964,895 B2 * | 11/2005 | Hsu .............................. 438/238 |
| 8,017,486 B2 * | 9/2011 | Huang et al. .................. 438/298 |
| 8,233,312 B2 * | 7/2012 | Xiao et al. .................... 365/149 |

* cited by examiner

*Primary Examiner* — Connie Yoha
(74) *Attorney, Agent, or Firm* — Global IP Services; Tianhua Gu

(57) ABSTRACT

The present invention discloses a DRAM cell utilizing floating body effect and a manufacturing method thereof. The DRAM cell includes a P type semiconductor region provided on a buried oxide layer, an N type semiconductor region provided on the P type semiconductor region, a gate region provided on the N type semiconductor region, and an electrical isolation region surrounding the P type semiconductor region and the N type semiconductor region. A diode of floating body effect is taken as a storage node. Via a tunneling effect between bands, electrons gather in the floating body, which is defined as a first storage state; via forward bias of PN junction, electrons are emitted out from the floating body or holes are injected into the floating body, which is defined as a second storage state. The present invention provides a highly efficient DRAM cell utilizing floating body effect with high density, which has low power consumption, has simple manufacturing process, and is compatible to the conventional CMOS and conventional logic circuit manufacturing process.

9 Claims, 9 Drawing Sheets

DRAM CELL UTILIZING FLOATING BODY EFFECT AND MANUFACTURING METHOD THEREOF

CROSS REFERENCE TO RELATED PATENT APPLICATION

The present application is the U.S. national stage of PCT/CN2010/075134 filed on Jul. 14, 2010, which claims the priority of the Chinese patent application No. 200910200965.4 filed on Dec. 25, 2009, which application is incorporated herein by reference.

BACKGROUND OF THE PRESENT INVENTION

1. Field of Invention

The present invention relates to a memory cell and a manufacturing method thereof, and particularly to a DRAM (dynamic random access memory) cell utilizing floating body effect (FBE) and a manufacturing method thereof, which belongs to semiconductor manufacturing field.

2. Description of Related Arts

With development of the ULSI (Ultra Large Scale Integration), processing unit, memory cell, analog circuit, logical interface, and even RF circuit are integrated into a single chip, forming a so called SoC (System on Chip). As important parts of SoC, embedded memory and logic circuit are integrated into a single chip, which takes more than 50% of the microprocessor or system chip area, and may take more area according the application requirement. The feature size of CMOS will continue to scale down to less than 40 nm according to Moore's law. The conventional embedded DRAM (eDRAM) is facing more and more difficulties in scaling down the feature size. Each memory cell of the conventional eDRAM includes a transistor and a capacitor (1T1C, one-transistor one-capacitor). It is very complicated to prepare stack capacitor by adopting high k material or prepare trench capacitor of high aspect ratio during the IC manufacturing process. The height of the memory unit is much larger than the width due to the structure of the trench capacitor (the ratio of height to width is over 30:1). Therefore the manufacturing process is very complicated and is not compatible with conventional CMOS ULSI manufacturing process. Therefore, the application of the eDRAM to SoC is limited.

In recent years, attention is paid to a kind of DRAM utilizing floating body effect. It removes the capacitor in the conventional DRAM, and takes isolated floating body as a storage node to write "1" and "0" by utilizing the floating body effect caused by the buried oxide layer (BOX) in the silicon on insulator (SOI). As shown in FIG. 1, the carries (holes) are gathered in the floating body, which is defined as a first storage status "1". As shown in FIG. 2, because the PN junction is positive biased, the carries (holes) are emitted out from the floating body, which is defined as a second storage status "0". Detecting the threshold voltage difference caused by the two statuses via current can realize the read operation. This kind of floating body cell (FBC) can constitute memory of high density, and has lower cost and simpler manufacturing process. The area of FBC is 3 to 5 times smaller than that of the SRAM. Therefore the conventional DRAM will be replaced by the FBC. It is reported that the floating body cell is one-transistor floating body (1T/FB) based on SOI. S. Okhonin et al. disclose such DRAM cell in *A Capacitor-less/T-DRAM Cell* of IEEE Electron Device Letters Vol. 23, No. 2 (February 2002), and T. Ohsawa et al. also disclose such DRAM cell in *Memory Design Using One-Transistor Gain Cell on SOI* of IEEE International Solid-State Circuits Conference (February 2002). FIG. 3 is a sectional view of a 1T/FB DRAM cell. The DRAM cell 100 includes a silicon substrate 101, a buried oxide layer 102, oxidation regions 103 and 104, $N^{++}$ type source region 105, $N^{++}$ type drain region 106, $N^+$ type source region 107, $N^+$ type drain region 108, P type floating body 109, gate oxidation region 110, gate electrode 111, side walls 112 and 113. The floating body 109 is to store charges so as to adjust the threshold voltage $V_T$ of the DRAM cell. The $N^{++}$ type source region 105 is usually grounded. When write "1" to the DRAM cell, apply a high voltage to the $N^{++}$ type drain region 106 and apply a medium voltage to the gate electrode 111 to produce a relative high electric field in the $N^{++}$ type drain region 106. The channel electrons in the high electric field of the $N^{++}$ type drain region 106 obtain enough energy to produce electron-hole pairs via collision. The holes move to the floating body with lower electric potential. Due to a barrier existing in the source-body junction, the holes will gather in the floating body to raise the electric potential of the floating body. Due to the body effect, when the voltage of the P type substrate rises, the threshold voltage falls, which is equivalent to an operation of writing "1". In order to write "0" to the DRAM cell, apply negative voltage to the $N^{++}$ type drain region 106 and apply medium voltage to the gate electrode 111. The electric potential of the substrate is positive due to the holes existing in the floating body, which causes the positive bias of the substrate-drain region PN junction. Then the holes in the floating body move to the drain region 106, so that the voltage of the substrate falls so as to raise the threshold voltage, which is equivalent to the operation of writing "0".

During the reading operation, apply medium voltage to the drain region 106 and the gate electrode 111, and ground the source region. When the stored data is "1", a relative large current flow through the source and drain region, and when the stored data is "1", a relative small current flows through the source and drain region, so that the data stored in the DRAM cell can be determined by comparing the current flowing through the source and drain region to the reference current. The gate electrode of the unchecked DRAM cell in the array contacts to the negative voltage to lower the leakage current and malfunction rate.

The 1T/FB memory cell reduces the area, which is only 4 to 7 $F^2$ (F means feature size), so that the integration of the memory cell is largely improved. The drawback of this memory cell is that the circuit and logic design is complicated and the leakage current is hardly controlled.

In order to further reduce the area of the memory cell, and lower the leakage current, the present invention provides a highly efficient DRAM cell utilizing floating body effect, which has low power consumption, has simple manufacturing process, and is compatible to the conventional CMOS and conventional logic circuit manufacturing process.

SUMMARY OF THE PRESENT INVENTION

The object of the present invention is to provide a DRAM cell and a manufacturing method thereof, using isolated floating body on SOI or GOI as storage node, so as to reduce the area of the memory and improve the integration density.

Accordingly, in order to accomplish the above object, the present invention provides a DRAM (dynamic random access memory) cell utilizing floating body effect comprising:

a buried oxide layer, a first P type semiconductor region provided on the buried oxide layer, a N type semiconductor region provided on the first P type semiconductor region, and a gate region provided on the N type semiconductor region, including a gate dielectric layer and a gate electrode on the gate dielectric layer, wherein a second P type semiconductor region is provided on one side of the N type semiconductor region and the second P type semiconductor region is communicated with the first P type semiconductor region;

wherein an electrical isolation region is provided around an active region formed by the N type semiconductor region, the first P type semiconductor region and the second P type semiconductor region to isolate the N type semiconductor region, the first P type semiconductor region and the second P type semiconductor region from other cells;

wherein a depletion region is formed by the first P type semiconductor region and the N type semiconductor region, and the second P type semiconductor region and the N type semiconductor region, and a floating body is formed by the electrical isolation region and the depletion region;

wherein a electrode connected to bit line is provided on the second P type semiconductor region.

Further, the electrical isolation region is a shallow trench isolation region.

Further, a spacer is provided around the gate region.

Further, the first P type semiconductor region is $P^+$ type semiconductor region and N type semiconductor region is $N^+$ type semiconductor region.

Further, the second P type semiconductor region is $P^{++}$ type semiconductor region.

A method of operating the DRAM cell utilizing floating body effect comprises writing the DRAM cell and reading the DRAM cell, wherein writing the DRAM cell comprises steps of applying a first positive voltage to a gate electrode and applying a first negative voltage to a bit line electrode, to foster electrons of a valence band in a P type semiconductor region to tunnel to a conduction band of a N type semiconductor region, and extra electrons to gather in a floating body of the N type semiconductor region, so that an electric potential of the floating body falls, and a forward threshold voltage of diode formed by the N type semiconductor region and P type semiconductor region is lowered, which is defined as a first storage status, and applying a second negative voltage to the gate electrode and applying a second positive voltage to the bit line electrode, to foster the electrons to be emitted out from the floating body and the holes drift from P type semiconductor region to the N type semiconductor region, so that extra holes are injected into the floating body of the N type semiconductor region, so that the electric potential of the floating body rises and the forward threshold voltage is raised, which is defined as a second storage status; and reading the DRAM cell comprises steps of applying a third negative voltage to the gate electrode, and grounding the bit line electrode, and then reading a forward current flowing through the N type semiconductor region and P type semiconductor region, selecting a reference current, and comparing the forward current to the reference current, wherein when the forward current is larger, the first storage status is identified, and when the forward current is smaller, the second storage status is identified.

Further, the first storage status is "1" and the second storage status is "0".

Further, the first positive voltage is ranging from 0.2V to 0.8V, the first negative voltage is ranging from −0.2V to −0.8V; the second negative voltage is ranging from −0.7V to −1.3V, the second positive voltage is ranging from 0.7V to 1.3V; the third negative voltage is ranging from −0.4V to −1.0V.

Further, the reference current is an initial forward current of the DRAM cell utilizing floating body effect without writing operation.

A method of manufacturing a DRAM cell utilizing floating body effect, comprises steps of:

(a) taking silicon on insulator (SOI) or Ge on insulator (GOI) having buried oxide layer as a substrate, and preparing a shallow trench isolation region on the buried oxide layer via shallow trench isolation (STI) process;

(b) preparing a $P^+$ type semiconductor region on the buried oxide layer using doping process within a semiconductor material isolated by the shallow trench isolation region, and preparing a $N^+$ type semiconductor region on the $P^+$ type semiconductor region, so as to obtain a first structure;

(c) preparing a gate dielectric material on the first structure obtained in step (b), and preparing a gate electrode material on the gate dielectric material;

(d) creating a gate region on the $N^+$ type semiconductor region by performing a lithography and etching process to the gate dielectric material and gate electrode material, so as to form an exposed part of the $N^+$ type semiconductor region;

(e) preparing a spacer around the gate region so as to obtain a second structure;

(f) doping the second structure obtained in step (e), so that the exposed part of $N^+$ type semiconductor region is doped to become an $P^{++}$ type semiconductor region;

(g) creating an electrode on the $P^{++}$ type semiconductor region as bit line electrode.

The method further comprises, before step (g), a step of quickly processing a structure obtained in step (f) with heat.

| | |
|---|---|
| 100 buried oxide layer | 200 semiconductor material |
| 201 first P type semiconductor region | 202 second P type semiconductor region |
| 203 N type semiconductor region | 300 shallow trench isolation region |
| 401 gate dielectric layer | 402 gate electrode |
| 401' gate dielectric material | 402' gate electrode material |
| 500 spacer | 600 bit line electrode |
| Vg voltage applied to the gate electrode | Vs voltage applied to the bit line |

DETAILED DESCRIPTION OF THE PREFERRED EMBODIMENT

The present invention is further explained in detail according to the accompanying drawings. It should be noted that figures are schematic representations of devices, and not drawn to scale.

Figure 1:
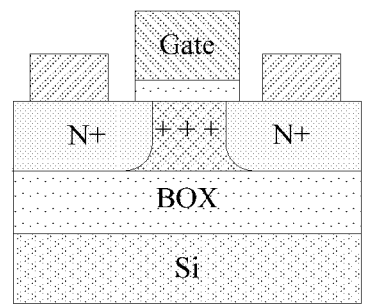
FIG. 1 illustrates a status of writing "1" of DRAM cell utilizing floating body effect of prior art.
Figure 2:
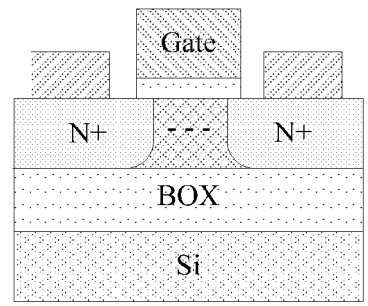
FIG. 2 illustrates a status of writing "0" of DRAM cell utilizing floating body effect of prior art.
Figure 3:
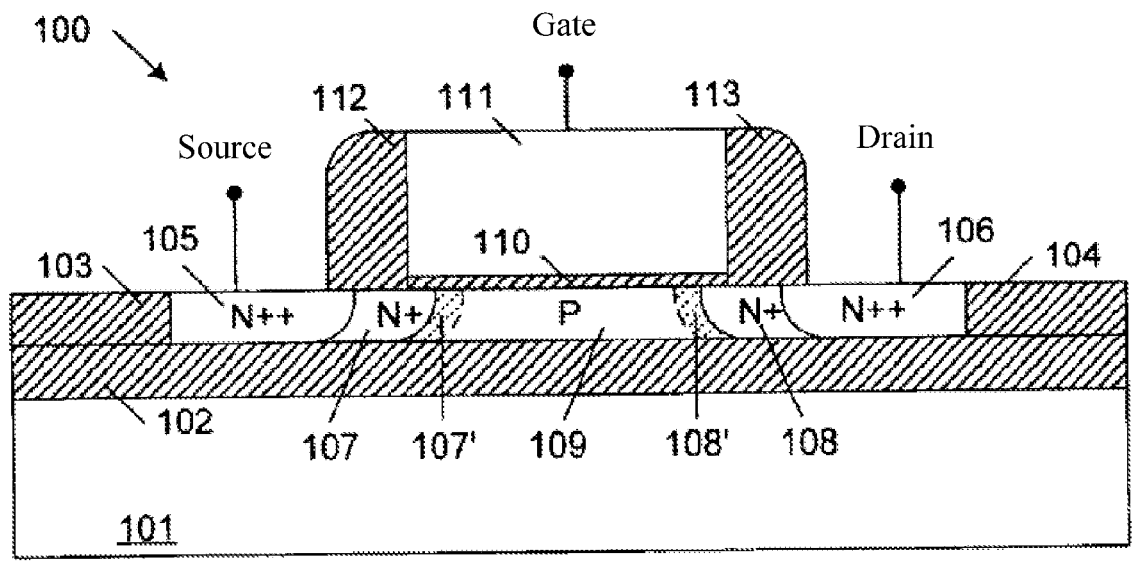
FIG. 3 is a sectional view of a DRAM utilizing floating body effect including one transistor of prior art.
Figure 4:
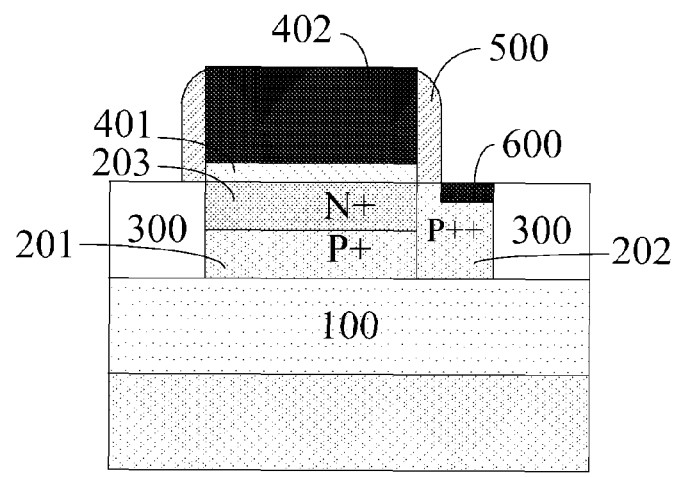
FIG. 4 is a sectional view of a DRAM cell utilizing floating body effect according to an embodiment of the present invention.

Referring to FIG. 4 of the drawings, a high efficient DRAM cell utilizing floating body effect based on the tunneling effect between bands comprises a buried oxide layer (BOX) 100, a first P type semiconductor region 201 provided on the buried oxide layer 100, a N type semiconductor region 203 provided on the first P type semiconductor region 201, a gate region provided on the N type semiconductor region 203, a second P type semiconductor region 202 provided on one side of the N type semiconductor region 203, wherein the second P type semiconductor region 202 communicates with the first P type semiconductor region 201, wherein the N type semiconductor region 203, the second P type semiconductor region 202 and the first P type semiconductor region 201 forms an active region, and a shallow trench isolation region 300 is provided around the active region to isolate the N type semiconductor region, the first P type semiconductor region and the second P type semiconductor region from other cells, wherein a depletion region is formed by the N type semiconductor region 203 and the first P type semiconductor region 201, and the N type semiconductor region 203 the second P type semiconductor region 202, and a electrically insulated floating body is formed by the shallow trench isolation region 300 and the depletion region. The gate region comprises a gate dielectric layer 401 and a gate electrode 402 provided on the gate dielectric layer. A spacer 500 is provided around the gate region.

The first P type semiconductor region 201 is $P^+$ type semiconductor region, and the N type semiconductor region 203 is $N^+$ type semiconductor region. They form highly doped $N^+/P^+$ diode structure, which is beneficial to the tunneling effect of electrons. A bit line electrode 600 is provided on the second P type semiconductor region 202. The second P type semiconductor region 202 adopts $P^{++}$ type semiconductor region 202 which is beneficial to the contact of the ohmic electrode.

Figure 5:
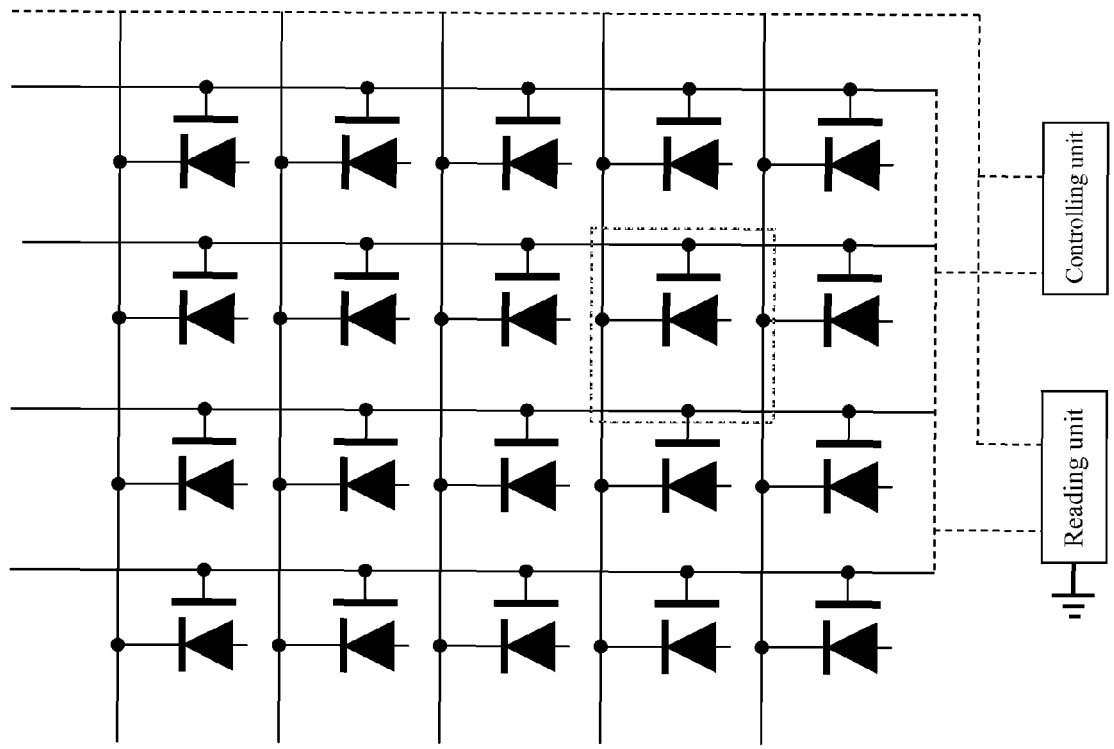
FIG. 5 is a schematic view of a DRAM formed by a DRAM cell array according to the embodiment of the present invention.

A floating body dynamic random access memory (DRAM) composed of a plurality of above-mentioned memory units is shown in FIG. 5. The gate electrode of the memory unit is led out as word line electrode to connect to word line. A bit line electrode provided on the highly doped $N^+/P^+$ diode structure is led out to connect to bit line. The memory unit is operated by applying different voltages to bit lines and word lines respectively.

The operating method of the floating body DRAM unit is illustrated hereinafter.

Figure 6:
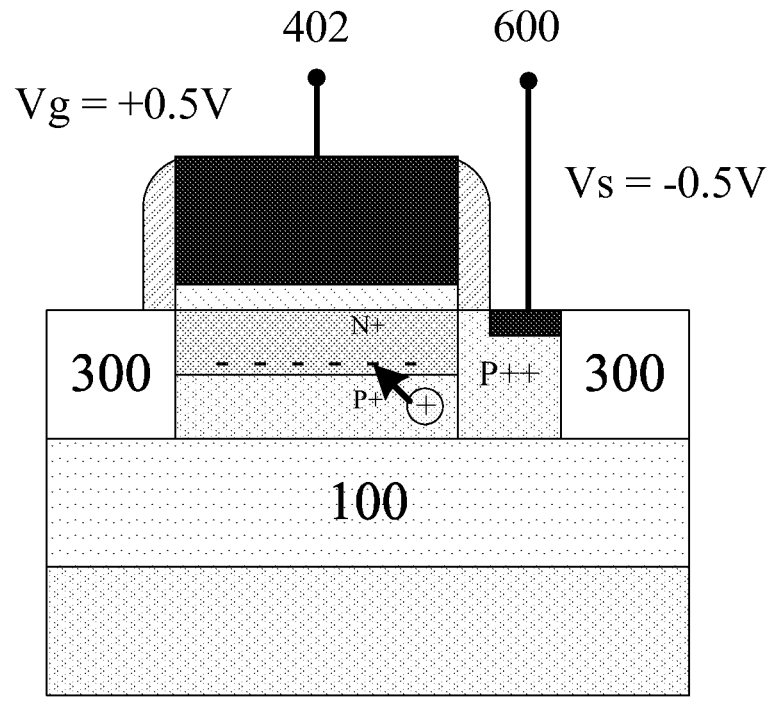
FIG. 6 is a schematic view of an operation of writing "1" according to the embodiment of the present invention.
Figure 7:
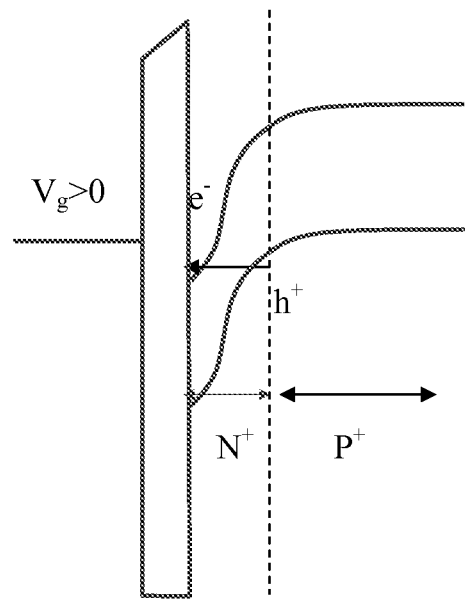
FIG. 7 is a schematic view of tunneling effect during an operation of writing "1" according to the embodiment of the present invention.

Write "1": Please referring to FIG. 6 of the drawings, apply a first positive voltage to the gate electrode and apply a first negative voltage to bit line electrode, so that the $N^+/P^+$ diode structure is reverse biased to foster the electrons of the valence band in the P type semiconductor region to tunnel to the conduction band of the N type semiconductor region. Then the extra electrons are left to gather in the floating body of the N type semiconductor region, and the electric potential of the floating body falls, so that the forward threshold voltage of diode formed by the N type semiconductor region and P type semiconductor region is lowered. The status of electrons gathering in the floating body is defined as a first storage status, which is the operation of writing "1". FIG. 7 is a schematic view of electrons e tunneling from the valence band in the $P^{++}$ type semiconductor region to the conduction band of the $N^+$ type semiconductor region.

Figure 8:
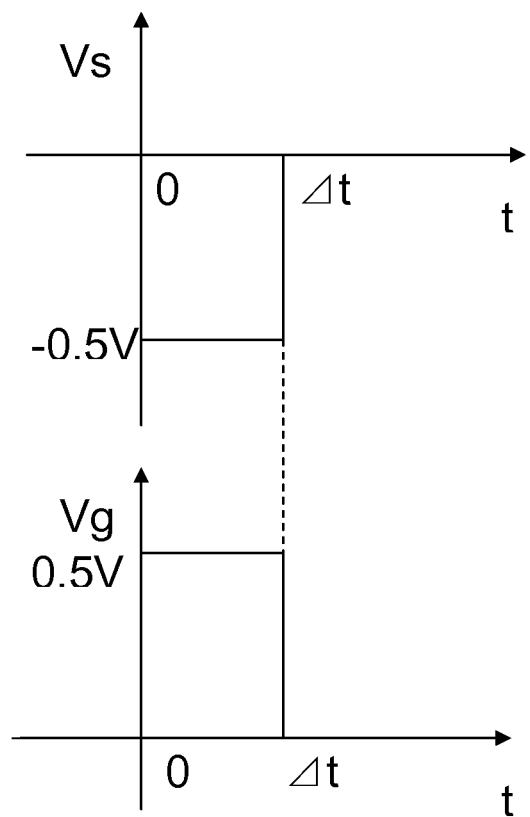
FIG. 8 is a diagram illustrating the relationship of voltage applied to the gate electrode and bit line electrode and applying period during an operation of writing "1" according to the embodiment of the present invention.

The first positive voltage is ranging from 0.2V to 0.8V, and the first negative voltage is ranging from −0.2V to −0.8V. In this preferred embodiment, the first positive voltage is 0.5V, and the first negative voltage is −0.5V. The relationship between the first positive voltage and first negative voltage and the voltage applying period is shown in FIG. 8. When the applied voltage value is unchanged, the longer Δt the voltage is applied, the more are the electrons gathered in the floating body, and the more impact is on the forward threshold voltage. Therefore, Δt should be determined according to the value of the applied voltage and volume of the memory cell.

Figure 9:
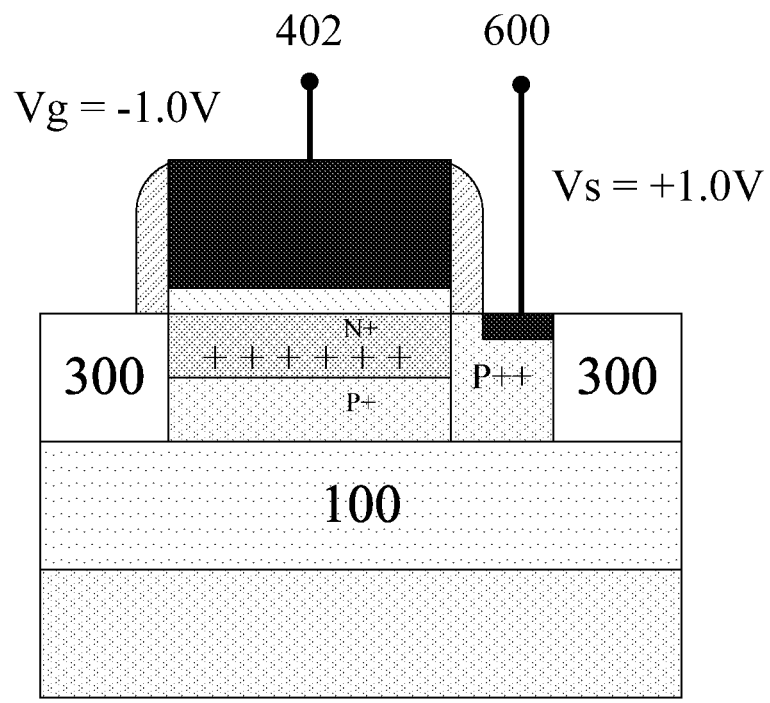
FIG. 9 is a schematic view of an operation of writing "0" according to the embodiment of the present invention.

Write "0": Referring to FIG. 9 of the drawings, apply a second negative voltage to the gate electrode and apply a second positive voltage to bit line electrode, so that the $N^+/P^+$ diode structure is forward biased to foster the electrons in the N type semiconductor region to drift to the P type semiconductor region. That is to say the electrons are emitted out from the floating body. The holes drift from P type semiconductor region to the N type semiconductor region, so that the extra holes are injected into the floating body of the N type semiconductor region. Therefore, the electric potential of the floating body rises, so that the forward threshold voltage is raised. The status of the electrons emitted out from the floating body or the holes injected into the floating body is defined as a second storage status, which is the operation of writing "0".

Figure 10:
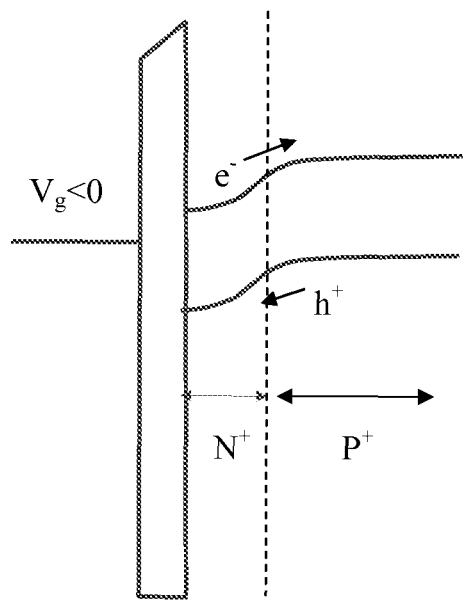
FIG. 10 is a schematic view illustrating the movement of the carriers during an operation of writing "0" according to the embodiment of the present invention.

FIG. 10 is a schematic view illustrating the movement of electrons e⁻ and holes h⁺.

Figure 11:
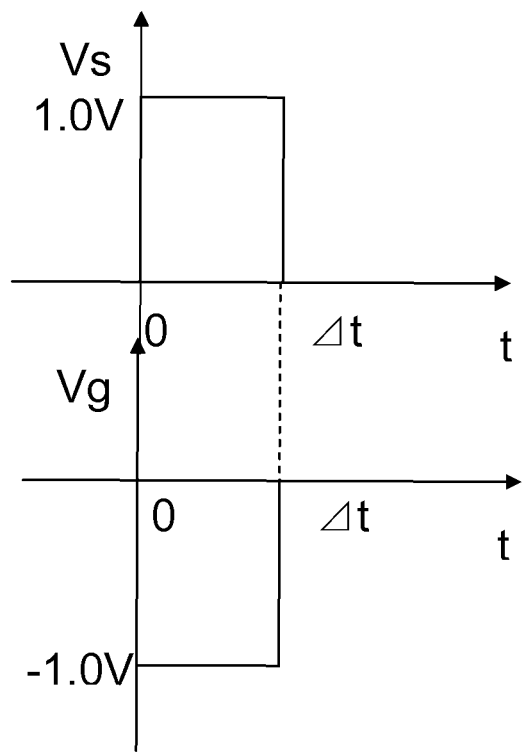
FIG. 11 is a diagram illustrating the relationship of voltage applied to the gate electrode and bit line electrode and the applying period during an operation of writing "0" according to the embodiment of the present invention.

The second negative voltage is ranging from −0.7V to −1.3V, and the second positive voltage is ranging from 0.7V to 1.3V. In this preferred embodiment, the second negative voltage is −1.0V, and the second positive voltage is 1.0V. The relationship between the second positive voltage and second negative voltage and the voltage applying period is shown in FIG. 11. When the applied voltage value is unchanged, the longer Δt the voltage is applied, the more are the electrons injected in the floating body, and the more impact is on the forward threshold voltage. Therefore, Δt should be determined according to the value of the applied voltage and volume of the memory cell. In this preferred embodiment, the voltage applying period Δt of writing "0" and writing "1" are same.

Figure 12:
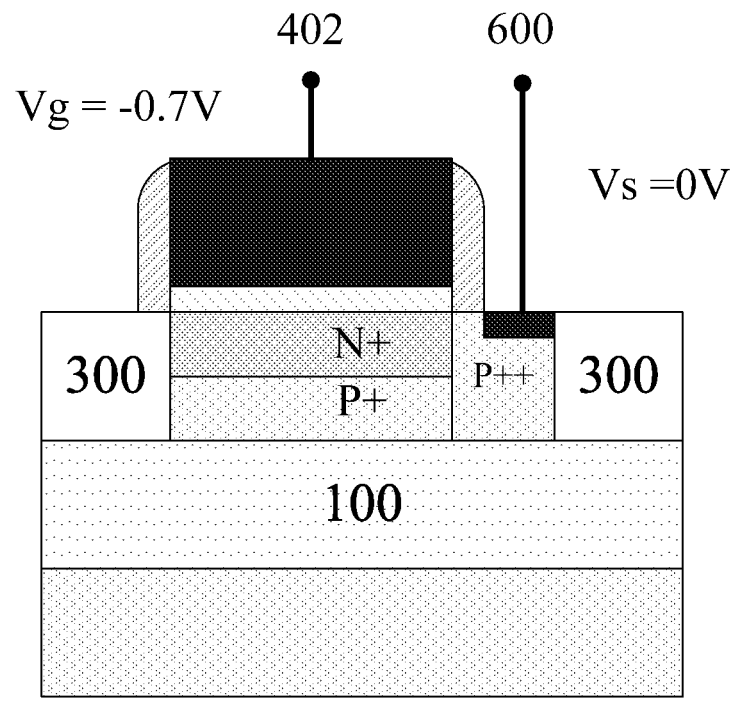
FIG. 12 is a schematic view of a reading operation according to the embodiment of the present invention.
Figure 13:
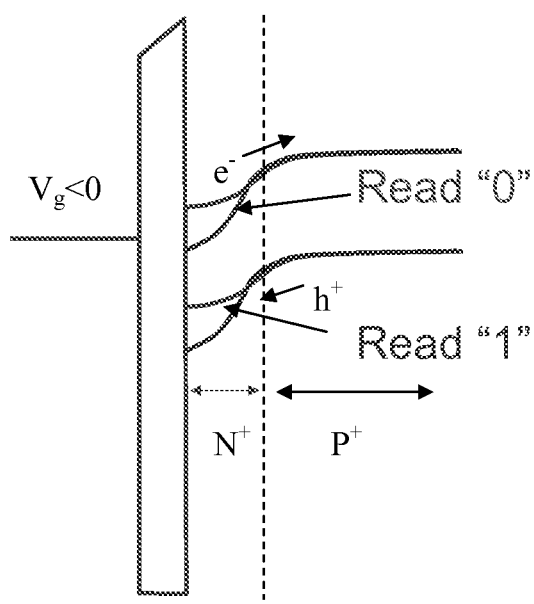
FIG. 13 is a schematic view illustrating the movement of the carriers during a reading operation according to the embodiment of the present invention.
Figure 14:
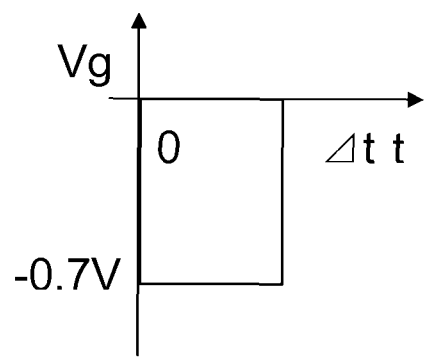
FIG. 14 is a diagram illustrating the relationship of voltage applied to the gate electrode and applying period during a reading operation according to the embodiment of the present invention.
Figure 15:
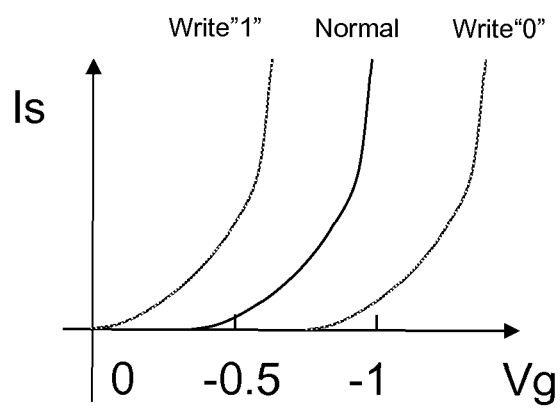
FIG. 15 is a diagram illustrating the relationship of voltage of gate and forward current when the DRAM cell is of different storage status.

Reading: As shown in FIG. 12, apply a third negative voltage to the gate electrode, and ground the bit line electrode, so that the N⁺/P⁺ diode structure is forward biased. Read the forward current flowing through the N type semiconductor region and P type semiconductor region, select a reference current, and compare the forward current to the reference current. When the positive current is larger, the first storage status is identified, which means the stored data is "1". When the positive current is smaller, the second storage status is identified, which means the stored data is "0". The reference current is the initial forward current of the DRAM cell utilizing floating body effect without any writing operation. FIG. 15 is a curve chart shows the relationship of the gate voltage and forward current, when the memory cell is in different storage statuses. FIG. 13 is a schematic view showing the movement of the carries during the reading operation. The third negative voltage is ranging from −0.4V to −1.0V, and preferably −0.7V in this preferred embodiment. The relationship between the third negative voltage and the applying period is shown in FIG. 14.

Refreshing operation: Writing "1" or "0" over the original data in the memory cell can refresh the original data of the memory cell. Due to the above-described structure of the present invention, the stored charges are not easily leaked, so that refreshing frequency can be reduced so as to lower the power consumption.

Please referring to FIG. 16a through 16g, a method of manufacturing a DRAM cell utilizing floating body effect includes the flowing steps.

Figure 16A:
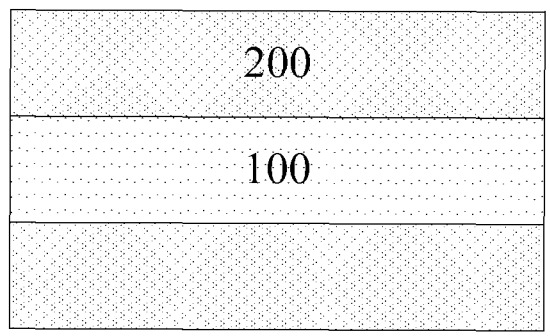
FIG. 16a is a schematic view of illustrating a first step of manufacturing a DRAM cell according to the embodiment of the present invention.
Figure 16B:
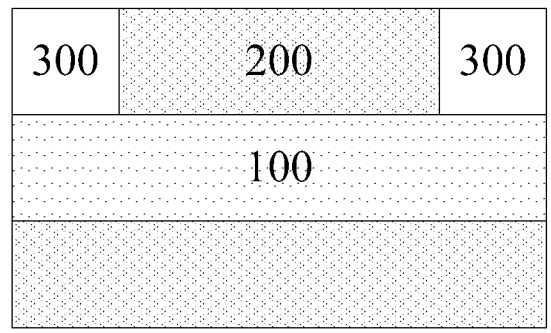
FIG. 16b is a schematic view of illustrating a second step of manufacturing a DRAM cell according to the embodiment of the present invention.

Step (a): Take silicon on insulator (SOI) or Ge on insulator (GOI) having a buried oxide layer 100 as a substrate, and prepare a shallow trench isolation region 300 on the buried oxide layer 100 via shallow trench isolation (STI) process, as shown in FIG. 16a.

Figure 16C:
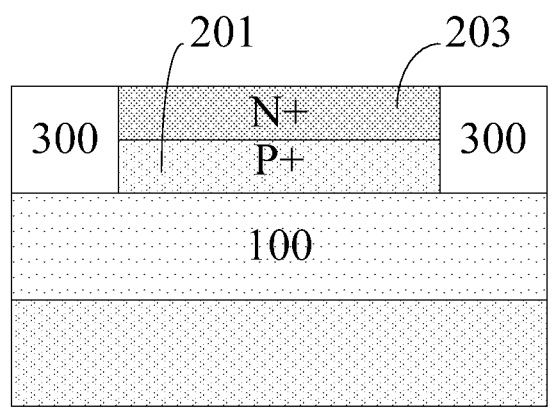
FIG. 16c is a schematic view of illustrating a third step of manufacturing a DRAM cell according to the embodiment of the present invention.

Step (b): Prepare a first P type semiconductor region (P⁺ type semiconductor region) 201 on the buried oxide layer 100 using doping process, such as ion implantation, within a semiconductor material 200 isolated by the shallow trench isolation region 300, and prepare a N type semiconductor region (N⁺ type semiconductor region) 203 on the P⁺ type semiconductor region, as shown in FIG. 16c.

Figure 16D:
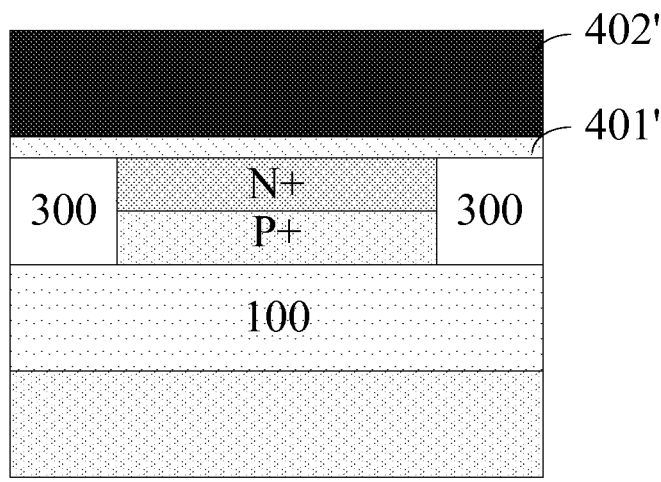
FIG. 16d is a schematic view of illustrating a fourth step of manufacturing a DRAM cell according to the embodiment of the present invention.

Step (c): Prepare a gate dielectric material 401' on a structure obtained in step (b), and prepare a gate electrode material 402' on the gate dielectric material 401', as shown in FIG. 16d. The material of gate dielectric material 401' is selected from the group consisting of SiO₂, SiOₓNᵧ, and high-k hafnium-based dielectric material. The material of gate electrode material 402' is selected from the group consisting of titanium, nickel, tantalum, tungsten, tantalum nitride, tungsten nitride, titanium nitride, titanium silicide, tungsten silicide and nickel silicide, or any combination thereof.

Figure 16E:
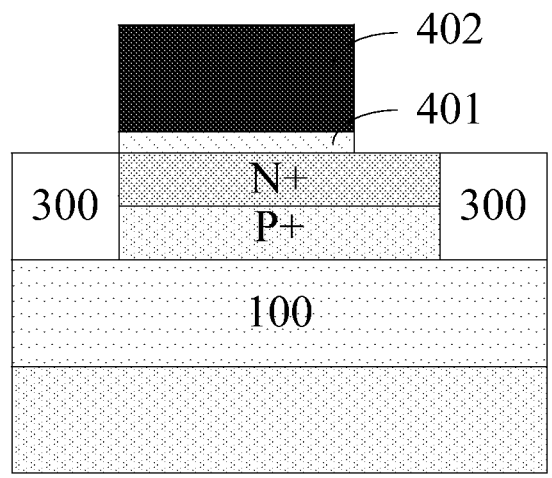
FIG. 16e is a schematic view of illustrating a fifth step of manufacturing a DRAM cell according to the embodiment of the present invention.

Step (d): Create a gate region on the N⁺ type semiconductor region (including a gate dielectric layer 401 and a gate electrode 402) by performing a lithography and etching process to the gate dielectric material 401' and gate electrode material 402', and expose a part of N⁺ type semiconductor region, as shown in FIG. 16e.

Step (e): Prepare a spacer 500 around the gate region so as to obtain a structure. The material of the spacer 500 may be SiO₂ or SiOₓNᵧ.

Figure 16F:
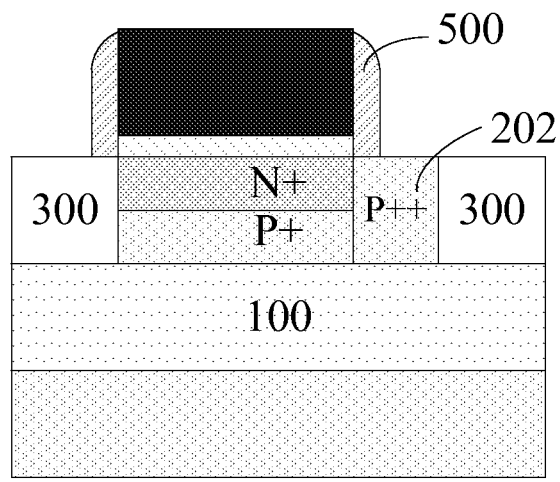
FIG. 16f is a schematic view of illustrating a sixth step of manufacturing a DRAM cell according to the embodiment of the present invention.

Step (f): Dope the structure obtained in step (e), so that the exposed part of P⁺ type semiconductor region is doped to become an P⁺⁺ type semiconductor region (second P type semiconductor region 202), as shown in FIG. 16f.

Figure 16G:
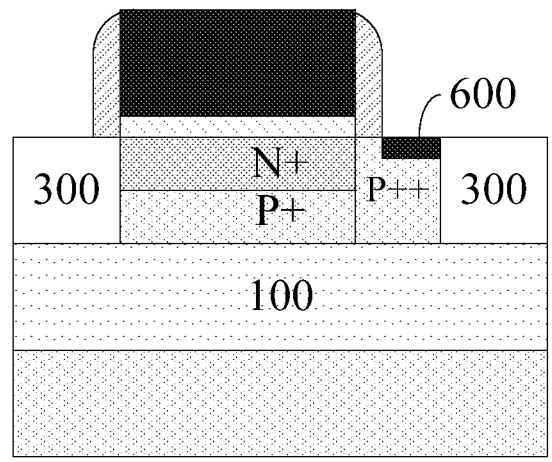
FIG. 16g is a schematic view of illustrating a seventh step of manufacturing a DRAM cell according to the embodiment of the present invention.

Step (g): quickly process the entire structure with heat, and create electrode on the P⁺⁺ type semiconductor region as bit line electrode 600, as shown in FIG. 16g. The electrode is selected from the group consisting of titanium, nickel, tantalum, tungsten, tantalum nitride, tungsten nitride, titanium nitride, titanium silicide, tungsten silicide and nickel silicide, or any combination thereof and preferably is silicide, such as titanium silicide, tungsten silicide and nickel silicide.

The DRAM cell utilizing floating body effect of the present invention has low power consumption, has simple manufacturing process, and is compatible to the conventional CMOS and conventional logic circuit manufacturing process.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A DRAM (dynamic random access memory) cell having floating body effect, comprising a buried oxide layer, a first P type semiconductor region provided on the buried oxide layer, a N type semiconductor region provided on the first P type semiconductor region, and a gate region provided on the N type semiconductor region, including a gate dielectric layer and a gate electrode on the gate dielectric layer, wherein a second P type semiconductor region is provided on one side of the N type semiconductor region and the second P type semiconductor region is communicated with the first P type semiconductor region;

wherein an electrical isolation region is provided around an active region formed by the N type semiconductor region, the first P type semiconductor region and the second P type semiconductor region;

wherein a depletion region is formed by the first P type semiconductor region and the N type semiconductor region, and the second P type semiconductor region and the N type semiconductor region, and a floating body is formed by the electrical isolation region and the depletion region;

wherein a electrode connected to bit line is provided on the second P type semiconductor region.

2. The DRAM cell having floating body effect, as recited in claim 1, wherein the electrical isolation region is a shallow trench isolation region.

3. The DRAM cell having floating body effect, as recited in claim 1, wherein a spacer is provided around the gate region.

4. The DRAM cell having floating body effect, as recited in claim 1, wherein the first P type semiconductor region is P$^+$ type semiconductor region and N type semiconductor region is N$^+$ type semiconductor region.

5. The DRAM cell having floating body effect, as recited in claim 1, wherein the second P type semiconductor region is P$^{++}$ type semiconductor region.

6. A method of operating the DRAM cell having floating body effect as recited in claim 1, comprising writing the DRAM cell and reading the DRAM cell, wherein writing the DRAM cell comprises steps of applying a first positive voltage to a gate electrode and applying a first negative voltage to a bit line electrode, to foster electrons of a valence band in a P type semiconductor region to tunnel to a conduction band of a N type semiconductor region, and extra electrons to gather in a floating body of the N type semiconductor region, so that an electric potential of the floating body falls, and a forward threshold voltage of diode formed by the N type semiconductor region and P type semiconductor region is lowered, which is defined as a first storage status, and applying a second negative voltage to the gate electrode and applying a second positive voltage to the bit line electrode, to foster the electrons to be emitted out from the floating body and the holes drift from P type semiconductor region to the N type semiconductor region, so that extra holes are injected into the floating body of the N type semiconductor region, so that the electric potential of the floating body rises, and the forward threshold voltage is raised, which is defined as a second storage status; and reading the DRAM cell comprises steps of applying a third negative voltage to the gate electrode, and grounding the bit line electrode, and then reading a forward current flowing through the N type semiconductor region and P type semiconductor region, selecting a reference current, and comparing the forward current to the reference current, wherein when the forward current is larger, the first storage status is identified, and when the forward current is smaller, the second storage status is identified.

7. The method of operating the DRAM cell having floating body effect, as recited in claim 6, wherein the first storage status is "1" and the second storage status is "0".

8. The method of operating the DRAM cell having floating body effect, as recited in claim 6, wherein the first positive voltage is ranging from 0.2V to 0.8V, the first negative voltage is ranging from −0.2V to −0.8V; the second negative voltage is ranging from −0.7V to −1.3V, the second positive voltage is ranging from 0.7V to 1.3V; the third negative voltage is ranging from −0.4V to −1.0V.

9. The method of operating the DRAM cell having floating body effect, as recited in claim 6, wherein the reference current is an initial forward current of the DRAM cell having floating body effect without writing operation.

* * * * *